United States Patent
Parkin (10) Patent No.: US 7,345,855 B2
(45) Date of Patent: Mar. 18, 2008

(54) TUNNEL BARRIERS BASED ON RARE EARTH ELEMENT OXIDES

(75) Inventor: Stuart Stephen Papworth Parkin, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 426 days.

(21) Appl. No.: 11/221,624

(22) Filed: Sep. 7, 2005

(65) Prior Publication Data
US 2007/0053113 A1 Mar. 8, 2007

(51) Int. Cl.
*G11B 5/127* (2006.01)
(52) U.S. Cl. .................................. 360/324.2
(58) Field of Classification Search ................ 360/122, 360/126, 324.2; 257/30, E43.005, E21.665; 365/173
See application file for complete search history.

(56) References Cited

U.S. PATENT DOCUMENTS

| | | |
|---|---|---|
| 5,390,061 A | 2/1995 | Nakatani et al. |
| 5,640,343 A | 6/1997 | Gallagher et al. |
| 5,650,958 A | 7/1997 | Gallagher et al. |
| 5,729,410 A | 3/1998 | Fontana, Jr. et al. |
| 5,764,567 A | 6/1998 | Parkin |
| 6,549,454 B1 | 4/2003 | Slaughter |
| 7,230,265 B2 * | 6/2007 | Kaiser et al. ................. 257/30 |
| 7,262,131 B2 * | 8/2007 | Narasimhan et al. ....... 438/643 |
| 2002/0076940 A1 | 6/2002 | Hibino |
| 2003/0184921 A1 | 10/2003 | Sugita et al. |
| 2004/0085807 A1 | 5/2004 | Hiramoto et al. |
| 2005/0006768 A1 * | 1/2005 | Narasimhan et al. ....... 257/751 |
| 2006/0071592 A1 * | 4/2006 | Narasimhan et al. ....... 313/506 |
| 2006/0159844 A1 * | 7/2006 | Moriwaki et al. .......... 427/127 |
| 2007/0115589 A1 * | 5/2007 | Huang et al. ............ 360/235.1 |

FOREIGN PATENT DOCUMENTS

| | | |
|---|---|---|
| JP | 63-224272 | 9/1988 |
| JP | 06-151982 | 5/1994 |

OTHER PUBLICATIONS

Parkin et al., "Giant tunnelling magnetoresistance at room temperature with MgO (100) tunnel barriers", Nature Materials, vol. 3, Dec. 2004, pp. 862-867.
M. Julliere, "Tunneling Between Ferromagnetic Films", Physics Letters, vol. 54A, No. 3, Sep. 8, 1975, pp. 225-226.
W. H. Butler et. al., "Spin-dependent tunneling conductance of Fe/MgO/Fe sandwiches", Physical Review B, vol. 63, pp. 054416-1 to 054416-12.
R. Meservey et al., "Spin-Polarized Electron Tunneling", Phys. Rep. vol. 238, No. 4, 1994, pp. 173-243.

* cited by examiner

*Primary Examiner*—Allen Cao
(74) *Attorney, Agent, or Firm*—Daniel E. Johnson (57) ABSTRACT

Magnetic tunnel junctions are disclosed that include ferromagnetic (or ferrimagnetic) materials and a bilayer tunnel barrier structure that includes a layer of a rare earth oxide. The bilayer also includes a layer of crystalline material, such as MgO or Mg—ZnO. If MgO is used, then it is preferably (100) oriented. The magnetic tunnel junctions so formed enjoy high tunneling magnetoresistance, e.g., much greater than 100% at room temperature.

20 Claims, 8 Drawing Sheets

TUNNEL BARRIERS BASED ON RARE EARTH ELEMENT OXIDES

TECHNICAL FIELD

The invention relates to an improved tunnel barrier for use in spintronic devices such as injectors of spin polarized current and the magnetic tunnel junction (MTJ). MTJ magnetoresistive (MR) devices find use as magnetic field sensors such as in read heads for reading magnetically recorded data, as memory cells in nonvolatile magnetic random access memory (MRAM) cells, and for magnetic logic and spintronic applications. More particularly, this invention relates to a method of forming improved composite tunnel barriers formed from rare-earth oxides and oxides of Mg, Al and Zn.

BACKGROUND OF THE INVENTION

The basic component of a tunnel spin injector and a magnetic tunnel junction is a ferromagnetic layer combined with a tunnel barrier. The basic structure of an MTJ is a sandwich of two thin ferromagnetic and/or ferrimagnetic layers separated by a very thin insulating layer. In both the spin injector and the MTJ, the electrons that tunnel from the ferromagnetic electrode across the tunnel barrier are spin polarized. The degree of spin polarization depends on both the composition and nature of the ferromagnetic metal, the tunnel barrier, and the interface between the two. In an MTJ the tunneling current is typically higher when the magnetic moments of the ferromagnetic (F) layers are parallel and lower when the magnetic moments of the two ferromagnetic layers are anti-parallel. The change in conductance for these two magnetic states can be described as a magneto-resistance. Here the tunneling magnetoresistance (TMR) of the MTJ is defined as $(R_{AP}-R_P)/R_P$ where $R_P$ and $R_{AP}$ are the resistance of the MTJ for parallel and anti-parallel alignment of the ferromagnetic layers, respectively. MTJ devices have been proposed as memory cells for nonvolatile solid state memory and as external magnetic field sensors, such as TMR read sensors for heads for magnetic recording systems. For a memory cell application, one of the ferromagnetic layers in the MTJ is the reference layer and has its magnetic moment fixed or pinned, so that its magnetic moment is unaffected by the presence of the magnetic fields applied to the device during its operation. The other ferromagnetic layer in the sandwich is the storage layer, whose moment responds to magnetic fields applied during operation of the device.

In the quiescent state, in the absence of any applied magnetic field within the memory cell, the storage layer magnetic moment is designed to be either parallel (P) or anti-parallel (AP) to the magnetic moment of the reference ferromagnetic layer. For a TMR field sensor for read head applications, the reference ferromagnetic layer has its magnetic moment fixed or pinned so as to be generally perpendicular to the magnetic moment of the free or sensing ferromagnetic layer in the absence of an external magnetic field. The use of an MTJ device as a memory cell in an MRAM array is described in U.S. Pat. No. 5,640,343. The use of an MTJ device as a MR read head has been described in U.S. Pat. Nos. 5,390,061; 5,650,958; 5,729,410 and 5,764,567.

Figure 1A:
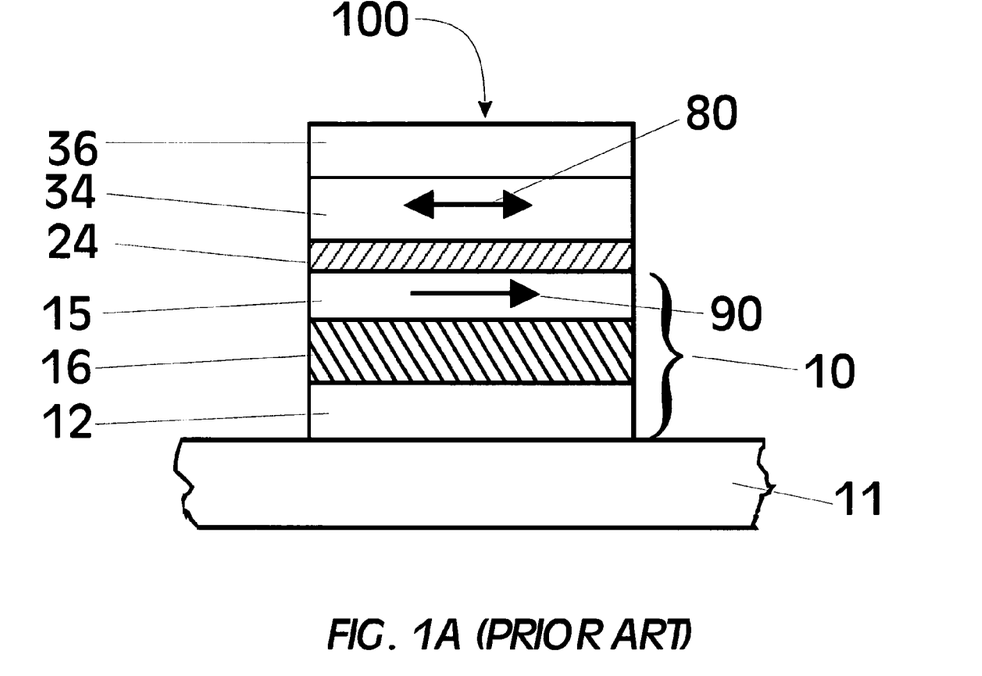
FIG. 1A shows a magnetic tunnel junction with a reference and a storage ferromagnetic layer.

FIG. 1A illustrates a cross-section of a conventional prior-art MTJ device. The MTJ 100 includes a bottom "fixed" or "reference" ferromagnetic (F) layer 15, an insulating tunnel barrier layer 24, and a top "free" or "storage" ferromagnetic layer 34. The MTJ 100 has bottom and top electrical leads 12 and 36, respectively, with the bottom lead being formed on a suitable substrate 11, such as a silicon oxide layer. The ferromagnetic layer 15 is called the fixed (or reference) layer because its magnetic moment is prevented from rotating in the presence of an applied magnetic field in the desired range of interest for the MTJ device, e.g., the magnetic field caused by the write current applied to the memory cell from the read/write circuitry of the MRAM. The magnetic moment of the ferromagnetic layer 15, whose direction is indicated by the arrow 90 in FIG. 1A, can be fixed by forming it from a high coercivity magnetic material or by exchange coupling it to an antiferromagnetic layer 16. The magnetic moment of the free ferromagnetic layer 34 is not fixed, and is thus free to rotate in the presence of an applied magnetic field in the range of interest.

Figure 1B:
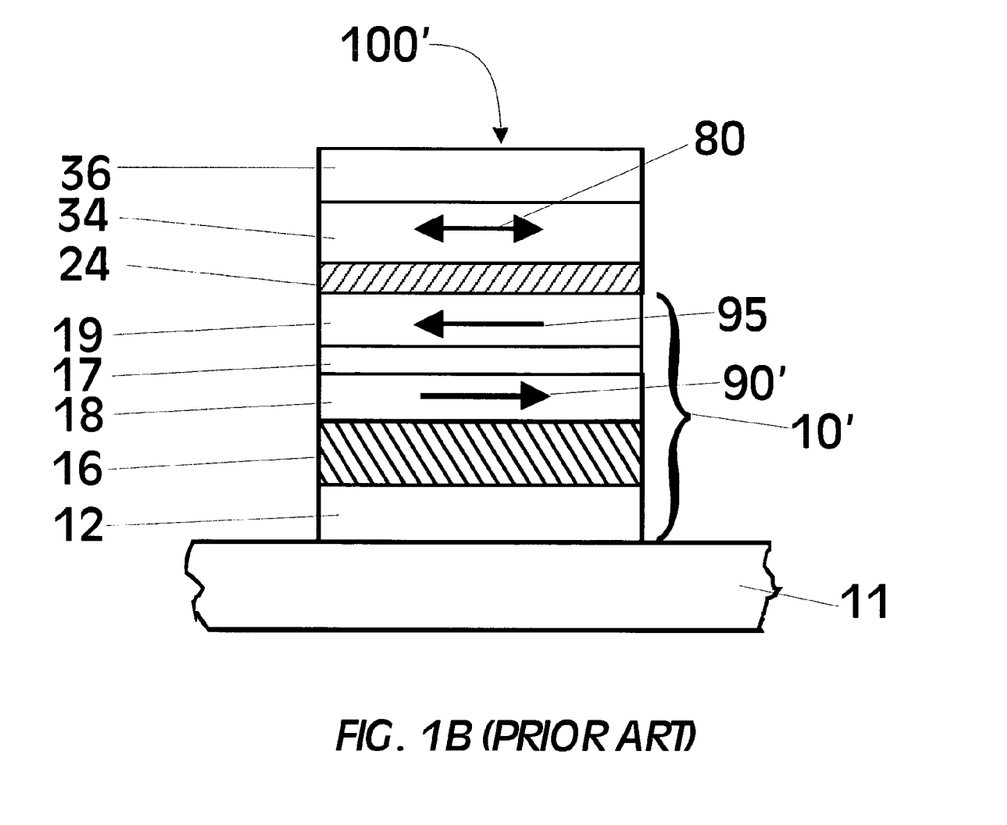
FIG. 1B shows a magnetic tunnel junction device with a reference layer (formed from a synthetic antiferromagnet) and a storage ferromagnetic layer.

In the absence of an applied magnetic field, the moments of the ferromagnetic layers 15 and 34 are aligned generally parallel (or anti-parallel) in an MTJ memory cell (as indicated by the double-headed arrow 80 in FIG. 1A) and generally perpendicular in a MTJ magnetoresistive read head. The relative orientation of the magnetic moments of the ferromagnetic layers 15, 34 affects the tunneling current and thus the electrical resistance of the MTJ device. The bottom lead 12, the antiferromagnetic layer 16, and the fixed ferromagnetic layer 15 together may be regarded as constituting the lower electrode 10. In FIG. 1B, the reference ferromagnetic layer 15 is replaced by a sandwich of two ferromagnetic layers 18 and 19 antiferromagnetically coupled through a metallic spacer layer 17 as shown by the MTJ 100' of FIG. 1B. The lower electrode is now given by the reference numeral 10', and the magnetic orientation of the layers 18 and 19 is given by the arrows 90' and 95, respectively.

MTJs can display large tunneling magnetoresistance (TMR) at room temperature of up to 70% using $Al_2O_3$ tunnel barriers and more than 220% using MgO tunnel barriers (S. S. P. Parkin et al., Nature Materials 3, 862 (2004)). The resistance of the MTJ depends on the relative orientation of the magnetizations of the F electrodes. Here we define $TMR=(R_{AP}-R_P)/R_L$ where $R_{AP}$ and $R_P$ correspond to the resistance for anti-parallel and parallel alignment of the F electrodes' magnetizations, respectively, and $R_L$ is the lower of either $R_P$ or $R_{AP}$. The TMR originates from the spin polarization of the tunneling current which can be measured most directly using superconducting tunneling spectroscopy (STS) in related tunnel junctions in which one of the ferromagnetic electrodes of the MTJ is replaced by a thin superconducting (S) layer. The TMR and spin polarization are then simply related according to Julliere's model (M. Juliere, Phys. Lett. 54A, 225 (1975)).

For applications of magnetic tunnel junctions for either magnetic recording heads or for non-volatile magnetic memory storage cells, high TMR values are needed for improving the performance of these devices. The speed of operation of the recording head or memory is related to the signal to noise ratio (SNR) provided by the MTJ—higher TMR values will lead to higher SNR values for otherwise the same resistance. Moreover, for memory applications, the larger the TMR, the greater is the device-to-device variation in resistance of the MTJs that can be tolerated. Since the resistance of an MTJ depends exponentially on the thickness of the tunneling barrier, small variations in thickness can give rise to large changes in the resistance of the MTJ. Thus high TMR values can be used to mitigate inevitable variations in tunnel barrier thickness from device to device. The resistance of an MTJ device increases inversely with the area of the device. As the density of memory devices increases in the future, the thickness of the tunnel barrier will have to be reduced (for otherwise the same tunnel barrier material) to maintain an optimal resistance of the MTJ memory cell for matching to electronic circuits. Thus a given variation in thickness of the tunnel barrier (introduced by whatever process is used to fabricate the MTJ) will become an increasingly larger proportion of the reduced tunnel barrier thickness and so will likely give rise to larger variations in the resistance of the MTJ device.

Different tunnel barrier materials have distinct advantages and disadvantages. For example, MgO tunnel barriers exhibit high tunneling magnetoresistance and tunneling spin polarization, have very high thermal stability and have relatively low resistance for the same tunnel barrier thickness as compared to, for example, aluminum oxide tunnel barriers. A potential disadvantage of crystalline MgO tunnel barriers is that the magnetic properties of the free or sensing magnetic layer, adjacent to the MgO barrier, may be influenced by the crystallinity of the MgO layer, leading possibly to greater variations in magnetic switching fields, from device to device, than are seen using amorphous barriers with no well defined crystallographic structure. Both MgO and alumina tunnel barriers have high tunnel barrier heights: The tunnel barrier height is related to the electronic band gap of the insulating material, and the band gaps of MgO and alumina are high. For applications where the device size is deep sub-micron in size and for ultra high speed applications, such as for advanced magnetic recording read head elements, lower tunnel barrier heights may be advantageous since these allow for lower resistance-area products or for thicker tunnel barriers with the same resistance-area product.

There is still a need for methods of preparing tunnel barriers of amorphous materials, which when formed on magnetic electrodes, do not substantially oxidize the underlying magnetic electrode, so as to form tunnel barriers that give rise to highly polarized tunneling current and magnetic tunnel junctions with high tunneling magnetoresistance.

SUMMARY OF THE INVENTION

One embodiment of the invention is a device that includes a tunnel barrier structure. The structure includes a first layer of a rare earth element oxide tunnel barrier and a second layer of at least one of a crystalline MgO tunnel barrier and a crystalline Mg—ZnO tunnel barrier. The tunnel barrier structure is in contact with an underlayer. The underlayer, the first layer, and the second layer are in proximity with each other, thereby enabling spin-polarized charge carrier transport between the underlayer and the first and second layers. The first layer may be amorphous, and the rare earth element oxide may advantageously include at least one of Lu, Gd, and Yb. The second layer may advantageously include crystalline grains that are substantially (100) oriented. Also, the tunnel barrier structure may further include an $Al_2O_3$ tunnel barrier, which is advantageously amorphous. The underlayer may include a semiconductor, e.g., at least one of Si and GaAs. Alternatively, the underlayer may include material selected from the group consisting of ferrimagnetic materials and ferromagnetic materials, and the device may further include an overlayer that likewise includes a material selected from the group consisting of ferrimagnetic materials and ferromagnetic materials; in this case, the underlayer, the tunnel barrier structure, and the overlayer form a magnetic tunnel junction.

One aspect of the invention is a method of forming the device. In this method, the second layer is formed by 1) depositing at least one first metal onto a surface of the underlayer to form a metal layer thereon, in which the surface is substantially free of oxide and 2) directing at least one second metal, in the presence of oxygen, towards the metal layer to form a metal oxide tunnel barrier in contact with the underlayer, in which the oxygen reacts with the second metal and the metal layer, and in which the metal oxide tunnel barrier includes Mg. The first layer is formed by forming a rare earth element oxide tunnel barrier over the metal oxide tunnel barrier. The method may further include annealing the metal oxide tunnel barrier to improve its performance. The metal oxide tunnel barrier may include at least one of a MgO tunnel barrier and a Mg—ZnO tunnel barrier.

Another aspect of the invention is yet another method of forming the device. In this method, at least one first metal that includes Mg is deposited onto a surface of the underlayer to form a metal layer thereon, in which the surface is substantially free of oxide. The method also includes directing at least one second metal that includes a rare earth element, in the presence of oxygen, towards the metal layer to form a bilayer in contact with the underlayer. The bilayer so formed includes the first layer and the second layer.

Yet another embodiment of the invention is a device that includes a first magnetic layer and a second magnetic layer, in which each of the first and second magnetic layers includes a material selected from the group consisting of ferrimagnetic materials and ferromagnetic materials. The device also includes a first tunnel barrier layer of a rare earth element oxide tunnel barrier and a second tunnel barrier layer of at least one of a crystalline MgO tunnel barrier and a crystalline Mg—ZnO tunnel barrier. The first and second tunnel barrier layers form a bilayer of tunnel barriers. The first magnetic layer, the tunnel barrier bilayer, and the second magnetic layer form a magnetic tunnel junction. The device advantageously has a tunneling magnetoresistance at room temperature of greater than 50%, 100%, 200%, or even 300%. The first and second magnetic layers may each include a Co—Fe alloy, and the rare earth element oxide preferably includes an oxide of at least one of Lu, Gd, and Yb.

The MgO and Mg—ZnO tunnel barriers of the magnetic tunnel junction devices disclosed herein are preferably prepared according to methods in which the lower ferromagnetic (or ferrimagnetic) electrode is not oxidized, so as to give much higher tunnel magnetoresistance values than in the prior art using other tunnel barrier material such as aluminum oxide. Similarly, much higher spin polarization values of tunneling current are obtained in tunnel junction devices with one or more ferromagnetic (or ferrimagnetic) electrodes. The MgO or Mg—ZnO tunnel barrier so formed does not have a significant number of defects that would otherwise lead to hopping conductivity through the tunnel barrier. In preferred methods, highly oriented (100) MgO or Mg—ZnO barriers are formed without using single crystalline substrates or high deposition temperatures, thereby facilitating the manufacture of devices using standard deposition techniques on polycrystalline or amorphous films. Post anneal treatments are preferred to improve the tunneling magnetoresistance, which for the MgO structures disclosed herein can exceed 50, 100, 150 or even 200% at room temperature, and which for the Mg—ZnO structures disclosed herein can exceed 50% at room temperature.

For several aspects and embodiments of the invention disclosed herein, a MgO or Mg—ZnO tunnel barrier is sandwiched between an underlayer and an overlayer, either one or both of which may include one or more layers of a ferromagnetic material and/or a ferrimagnetic material. While the MgO (or Mg—ZnO) tunnel barrier is preferably in direct contact with the ferromagnetic material and/or ferrimagnetic material, each of the underlayer and overlayer may optionally include one or more spacer layers which are adjacent to the tunnel barrier but which do not significantly affect the tunneling properties of the MgO (or Mg—ZnO) layer, e.g., by not significantly diminishing the spin polarization of electrons tunneling through the tunnel barrier. For example, Au or Cu may be used as non-magnetic spacer layers or the spacer layer may be comprised of a conducting oxide layer. (It should be understood that the terms underlayer and overlayer do not necessarily imply any particular orientation with respect to gravity.)

Performance of the MgO (or Mg—ZnO) tunnel barriers disclosed herein may be improved through annealing, wherein performance refers to various attributes of the tunnel barrier or associated device. For example, annealing a magnetic tunnel junction improves, in particular, its magneto-tunneling resistance; annealing a tunnel barrier improves, in particular, its spin polarization. In particular by annealing these tunnel barriers, tunneling magneto-resistance of more than 100% can readily be achieved using methods of thin film deposition and substrate materials compatible with conventional manufacturing technologies. Annealing temperatures may be in the range from 200° C. to 400° C. or even higher; however, the best tunnel barrier performance was obtained for annealing temperatures in the range from 300° C. to 400° C. The same anneal that improves the tunneling magnetoresistance may also be used to set the direction of an optional exchange bias field provided by an antiferromagnetic exchange bias layer and may also be used to set a direction of a uniaxial magnetic anisotropy in the magnetic electrodes.

The preferred embodiments and implementations of the invention are directed to MgO or Mg—ZnO tunnel barrier layers which are substantially (100) oriented or textured. Certain non-amorphous magnetic layers and tunnel barrier layers are polycrystalline and are comprised of grains or crystallites which range in lateral extent from approximately one hundred to several hundred angstroms (e.g., 500 angstroms). Thus, these layers and the overall film structure are what is commonly referred to as textured. Texturing implies that there is a predominant crystallographic orientation of individual layers and/or the overall film structure, but that the grains are not perfectly aligned along one particular direction. Individual grains may not be precisely oriented with their (100) direction along the normal to the film layer, but the (100) direction within individual grains may be oriented away from the normal to the plane of the film by an angle that can vary from a small fraction of one degree to several degrees or even tens of degrees for poorly textured films. The angular range of these (100) directions can be used to quantify the degree of (100) crystalline texture of the film structure and can be measured using various structural characterization techniques, including cross-section transmission electron microscopy and various x-ray diffraction techniques. There may also be present grains which are oriented in a completely different direction, but the proportion of these grains is small for the method of formation of the magnetic tunnel junction structures described herein. Note that the crystalline grains are randomly oriented with respect to a direction within the plane of the substrate on which the film structures are grown. It is the orientation or texturing of the film which is important with regard to the preferred embodiments herein. Whereas the maximum TMR is obtained for film structures which are highly textured, the TMR will be increased to the extent that the film structure is textured. It is preferred that the angular range of a (100) direction within the grains be within + or −20 degrees of the film normal, or more preferably within + or −10 degrees, and even more preferably within + or −5 degrees. As used herein, the term "(100) oriented" should be understood to include the aforementioned deviations from the ideal case, in which all the grains are precisely oriented with their (100) direction along the normal to the film layer.

BRIEF DESCRIPTION OF THE DRAWINGS

FIG. 1, which includes FIGS. 1A and 1B, is a schematic of a magnetic tunnel junction formed in accordance with the prior art.

DESCRIPTION OF THE PREFERRED EMBODIMENTS

The tunneling current in an MTJ is spin polarized, which means that the electrical current passing from one of the ferromagnetic layers is predominantly composed of electrons of one spin type (spin up or spin down, depending on the orientation of the magnetization of the ferromagnetic layer). The tunneling spin polarization P of the current can be inferred from a variety of different measurements. The measurement most relevant to magnetic tunneling is to measure the conductance as a function of bias voltage for junctions formed from a sandwich of the ferromagnetic material of interest and a superconducting counter electrode (R. Meservey and P. M. Tedrow, Phys. Rep. 238, 173 (1994)). These studies show that the spin polarization of the tunnel current measured in this way can be simply related to the TMR close to zero bias voltage as first proposed by Julliere (M. Julliere, Phys. Lett. 54A, 225 (1975)). In such a model P is defined as $(n_\uparrow - n_\downarrow)/(n_\uparrow + n_\downarrow)$, where $n_\uparrow$ and $n_\downarrow$ are the density of spin up and spin down states at the ferromagnet/insulator interface. By assuming that the tunnel current is comprised of two independent majority and minority spin currents and that these currents are related to the respective density of states of the majority and minority carriers in the opposing ferromagnetic electrodes, the TMR can be formulated by the relation $TMR=(R_{AP}-R_P)/R_P=2P_1P_2/(1-P_1P_2)$, where $R_{AP}$ and $R_P$ are the resistances of the MTJ for anti-parallel and parallel orientation of the ferromagnetic electrodes, respectively, and $P_1$ and $P_2$ are the spin polarization values of the two ferromagnetic electrodes.

Experimentally, it is clear that the magnitude of the TMR is extremely sensitive to the nature of the interface between the tunneling barrier and the ferromagnetic electrode. By changing the properties of the interface layer, for example, by inserting very thin layers of non-magnetic metals between the ferromagnet and the insulator layers, the TMR can be dramatically altered. Based on such observations, most experimental data on magnetic tunneling have usually been interpreted by assuming that P is largely determined by the electronic structure of the ferromagnetic interface layer essentially independent of the tunnel barrier electronic structure. However, P can also be strongly influenced by the probability of tunneling of electrons, which depends not only on their spin but also on the tunneling matrix element. The tunneling matrix element is determined by the detailed electronic structure of the ferromagnet, the tunnel barrier, and the interface between the ferromagnetic electrode and the tunnel barrier. For the same ferromagnetic electrode, the polarization of the tunneling current P varies depending on the material and structure of the tunnel barrier.

The possibility of high tunneling magnetoresistance in MTJs formed from Fe/MgO/Fe sandwiches where the tunnel barrier is formed from crystalline (100) oriented MgO layers was theorized by W. H. Butler, X.-G. Zhang, T. C. Schulthess et al., Phys. Rev. B 63, 054416 (2001). High TMR could result from the very slow decay through the tunnel barrier of majority electrons of a particular symmetry for the (100) orientation of Fe/MgO. This also means that the polarization of the tunneling electrons should also be very high. However, extensive experimental work by many groups over a period of several years showed no evidence for improved tunneling magnetoresistance values using crystalline (100) MgO tunnel barriers as compared to amorphous alumina tunnel barriers. It was speculated that during the formation of the MgO tunnel barrier, the surface of the lower Fe electrode became oxidized perhaps resulting in much lower TMR than theorized.

Figure 3:
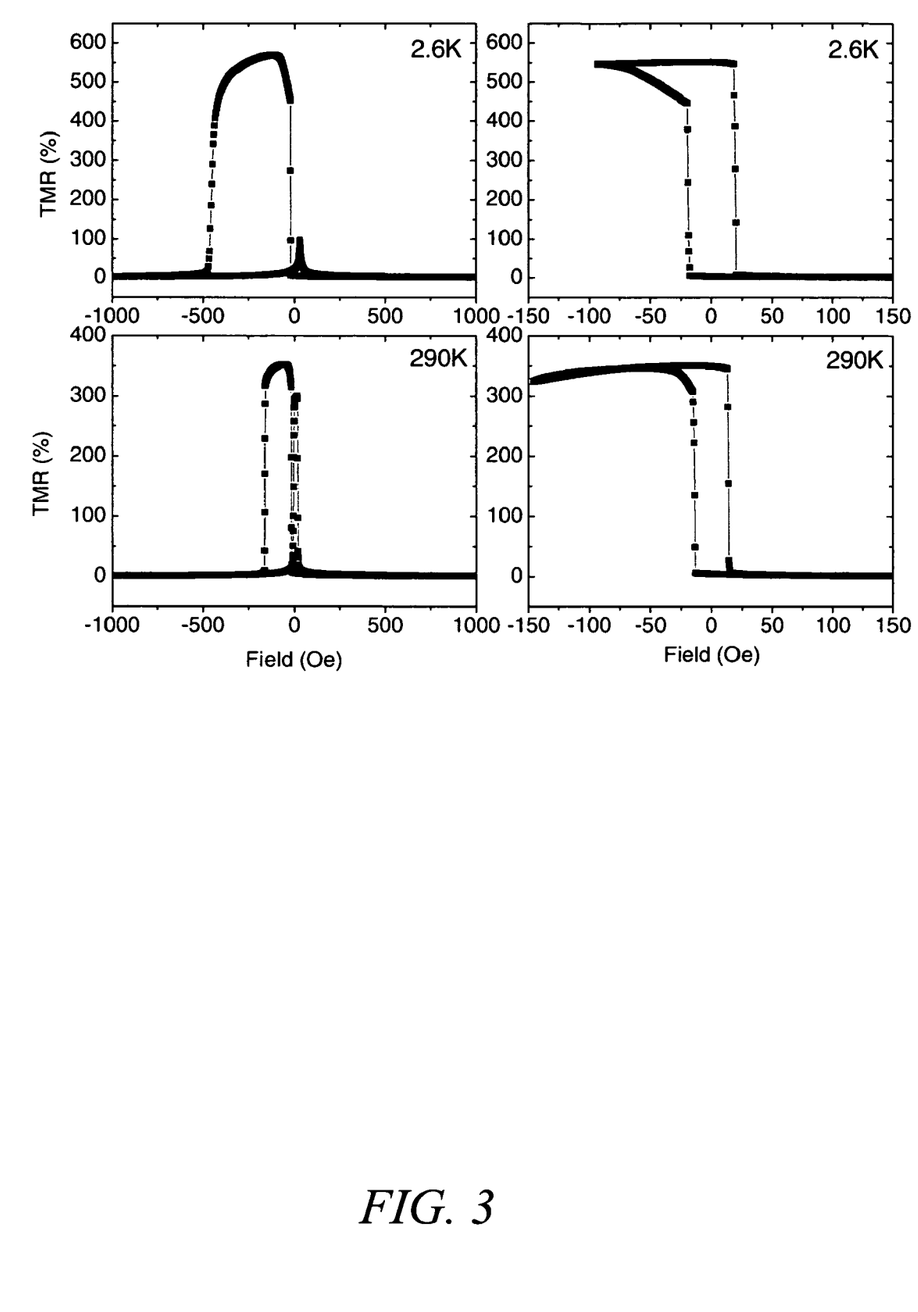
FIG. 3 shows resistance versus field curves for major and minor magnetic hysteresis loops for an MTJ with a MgO tunnel barrier which exhibits more than 340% TMR at room temperature (and more than 550% TMR at 2.6 K).

In U.S. patent application Ser. No. 10/973,954 to Parkin titled "MgO tunnel barriers and method of formation" filed Oct. 25, 2004, which is hereby incorporated by reference, a method for forming MgO tunnel barriers is described which gives rise to MTJs that exhibit extraordinarily high values of tunneling magnetoresistance. To prevent the oxidation of a lower electrode formed from Fe, a method of forming the MgO barrier was developed in which a thin layer of metallic Mg was first deposited on top of the Fe layer and then a layer of MgO was deposited on top of this Mg layer through the reactive sputtering of Mg in an Ar—$O_2$ plasma. Using this method of preparing the MgO barrier, very high tunneling magnetoresistance values were obtained, much higher than any previously reported values for any MTJ at room temperature. For example, FIG. 3 shows data for an MTJ with a MgO tunnel barrier which exhibits more than 340% TMR at room temperature (and more than 550% TMR at 4K).

Figure 2A:
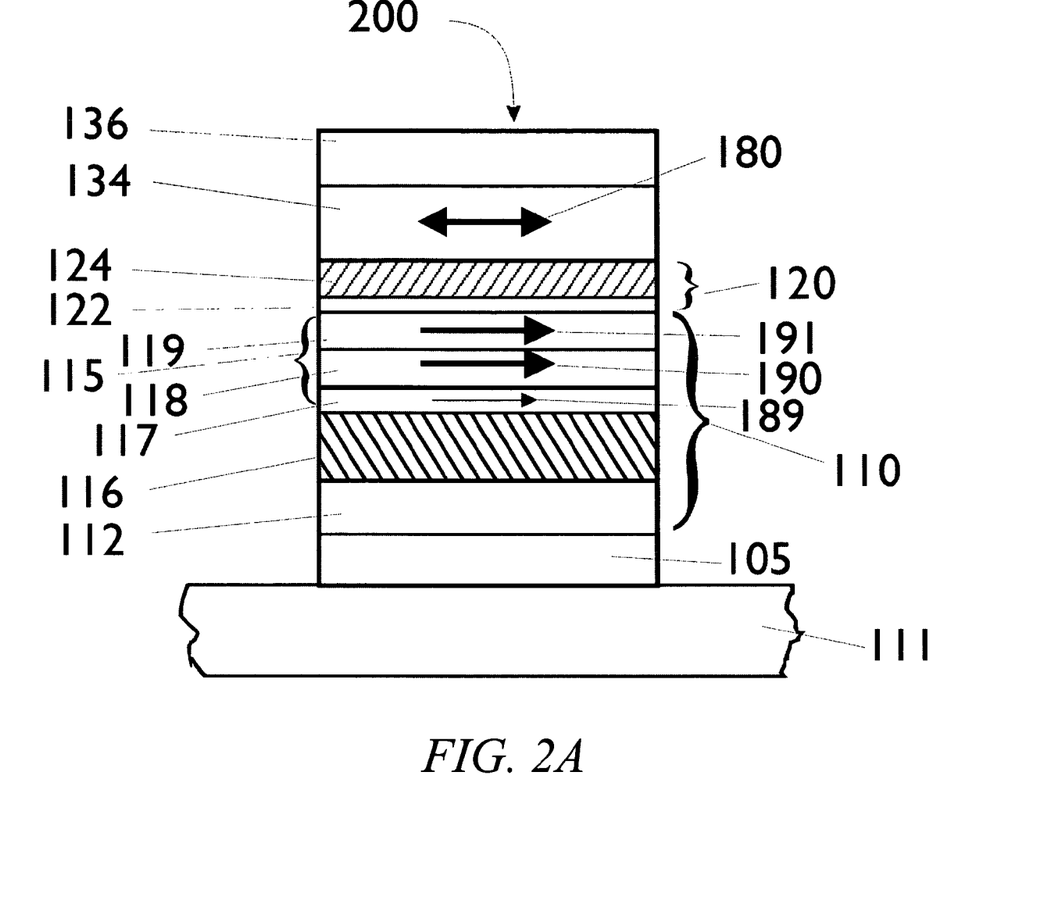
FIG. 2A illustrates the sequence of layers that are deposited to form a magnetic tunnel junction having high tunneling magnetoresistance (TMR).
Figure 2B:
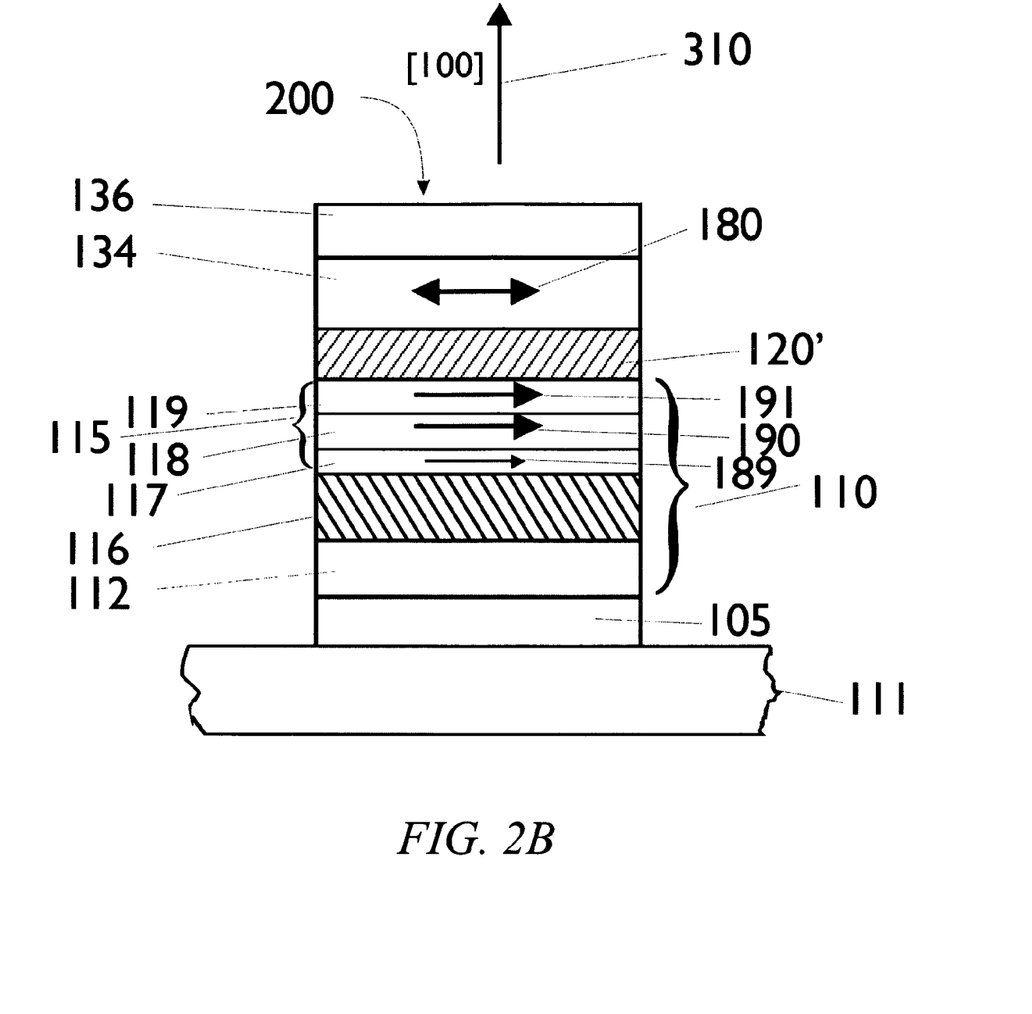
FIG. 2B is a cross sectional view of the magnetic tunnel junction that is formed according to the methodology of FIG. 2A.

FIG. 2A illustrates this process of forming a MTJ 200, in which a tunnel barrier 120 is formed by first depositing a thin Mg layer 122 followed by deposition by reactive sputtering of an MgO layer 124. As shown in FIG. 2B, it is more appropriate to view the MgO tunnel barrier as a single layer 120', since the layer 122 is oxidized to form MgO, with the layers 122 and 124 becoming largely indistinguishable as a result. For example, the layers 122 and 124 are not distinguishable in a cross-sectioned slice of the device examined in a transmission electron microscope. The thickness of the resulting MgO layer 120' is preferably in the range of 3-50 angstroms, more preferably 3-30 angstroms, still more preferably 3-20 angstroms, and most preferably 4-15 angstroms.

FIG. 2A shows a device that includes a substrate 111, a bottom electrical lead 112, an antiferromagnetic layer 116, a fixed ferromagnetic (or ferrimagnetic) layer 115, a "free" ferromagnetic (or ferrimagnetic) layer 134, and a top electrical lead 136, all of which are similar to their FIG. 1B counterparts 11, 12, 16, 18, 34, and 36, respectively; these layers, as well as other layers and components referred to herein, may be constructed using techniques known to those skilled in the art. The arrows 180 and 190 illustrate possible orientations of the magnetic moments of the free ferromagnetic layer 134 and the fixed ferromagnetic layer 115, respectively. As shown in FIGS. 2A and 2B, the fixed ferromagnetic layer 115 may comprise more than one magnetic layer and, for example, be comprised of a bilayer of two different ferromagnetic layers 118 and 119, each having a magnetic moment oriented as indicated by the arrows 190 and 191, respectively. The layer 115 may also be comprised of a trilayer, 117, 118 and 119, each of these magnetic layers with a magnetic moment oriented along the direction indicated by the arrows shown in the figure as 189, 190 and 191. The magnetic layer 115, the antiferromagnetic layer 116, and the bottom lead 112 of FIGS. 2A and 2B constitute a lower electrode 110. The lower electrode may be formed on an additional template layer 105.

MTJ structures formed according to the method described in U.S. patent application Ser. No. 10/973,954 to Parkin titled "MgO tunnel barriers and method of formation" (filed Oct. 25, 2004), exhibit very high tunneling magnetoresistance values of more than 160% at room temperature. However, the high tunneling magnetoresistance is derived not only from using a method of forming the MgO tunnel barrier which does not oxidize the lower ferromagnetic electrode, but also from forming a crystalline structure in which the ferromagnetic electrodes directly above and below the (100) textured MgO tunnel barrier have a bcc crystalline structure and are also textured in the (100) orientation. The layer 115 is preferably formed from a bcc alloy formed from one or more of Co and Fe. For example, layer 118 may be formed from Fe or $Co_{84}Fe_{16}$ and layer 119 may be formed from $Co_{70}Fe_{30}$. The crystallographic texture of these layers can be controlled by suitable choice of the underlayers. For example layer 112 may be formed from a bi-layer of TaN and Ta or from a layer of Ta alone. Layer 112 may also comprise other layers for improved growth of the MTJ device 200. In particular, layer 112 may be grown on a layer 105 of MgO which improves the growth and crystalline texture of the subsequent layers. Layer 116 may be formed from an fcc antiferromagnetic alloy of Ir and Mn where the composition of Ir is less than ~30 atomic percent. The IrMn layer grows highly oriented in the (100) orientation when deposited on the layer 112 formed from Ta or TaN/Ta. The substrate 111 may be comprised of an amorphous material such as $SiO_2$.

Using this combination of underlayers, the layer 115, which may be comprised of one or more bcc Co—Fe alloys and nominally amorphous CoFeB layers, is textured in the (100) orientation and the MTJ 200 displays high TMR. For example, an additional layer 117 may be formed from $[Co_{1-x}Fe_x]_{1-y}B_y$, where the composition of the Co—Fe component is chosen so that the corresponding alloy without B is typically bcc, and the B content is chosen so that this layer is normally amorphous when the layer is sufficiently thick and is not subjected to a temperature at which the amorphous alloy would crystallize and take up a crystalline structure.

Thus the B content may range from 8 to 35 atomic percent. The thickness of the layer 117 is chosen to be very thin, as thin as ~3 Å. This layer serves two possible purposes. On the one hand Mn from the IrMn antiferromagnetic layer diffuses from this layer through the layer 115 to the tunnel barrier 120 when the MTJ device is thermally annealed. The layer 117 may serve to reduce the amount of Mn diffusion which is deleterious for the TMR exhibited by the device. On the other hand the layer 117 may serve to improve the smoothness, crystalline texture and/or the crystalline perfection of the MgO tunnel barrier.

A method of forming $Mg_{1-x}Zn_xO$ tunnel barriers is now described in connection with FIGS. 2A and 2B; $Mg_{1-x}Zn_xO$ tunnel barriers may be used instead of MgO tunnel barriers in the structures disclosed herein to form alternative embodiments. (See also U.S. application Ser. No. 10/982,075 to Parkin titled "Mg—Zn oxide tunnel barriers and method of formation" filed Nov. 5, 2004, which is hereby incorporated by reference.) The $Mg_{1-x}Zn_xO$ tunnel barriers are formed by i) first depositing, for example, a Mg—Zn layer without any oxygen (so that this Mg—Zn layer covers the underlying ferromagnetic or ferrimagnetic layer), and then by ii) depositing, for example, a layer of Mg—Zn in the presence of reactive oxygen during which process the previously deposited first Mg—Zn layer is oxidized, thereby forming the tunnel barrier.

The Mg—Zn composition of the metal layer 122 does not need to be the same as the Mg—Zn composition of the oxide layer 124. Indeed the layer 122 can be formed from pure Mg and the layer 124 can be formed from pure ZnO. Alternatively, the layer 122 can be formed from pure Mg and the layer 124 from $[Mg_{1-x}Zn_x]O$. Alternatively, the layer 122 can be formed from an alloy with a composition $[Mg_{1-y}Zn_y]$, whereas the layer 124 can be formed by the deposition of a layer of composition $[Mg_{1-z}Zn_z]$ in the presence of reactive oxygen.

In general, to form a Mg—Zn oxide tunnel barrier according to preferred implementations of the invention herein, it is only necessary that one of the layers 122 and 124 include Mg and that the other of these layers include Zn.

The Zn concentration in the layer 122 can be higher or lower than that of the layer 124. The concentration of Zn in the layer 122 is preferably chosen to optimize the growth of the Mg—ZnO tunneling barrier 120' as well as for the target resistance-area product (RA) value. More Zn will lead to an oxide barrier with a reduced tunnel barrier height and so lower RA. Similarly, increasing the concentration of Zn in the oxide layer 124 will also lead to lower tunneling barrier heights and so to lower RA values. For the optimal tunnel barrier with the highest thermal stability, it may be preferable to form the layer 122 from an alloy of Mg—Zn with less Zn or even from pure Mg. It may also be preferable to form a tunnel barrier by first depositing a layer of Mg or a Mg—Zn alloy with small amounts of Zn, then by secondly depositing a layer of $[Mg_{1-x}Zn_x]$ in the presence of reactive oxygen (in which this layer contains a higher concentration of Zn), then by thirdly depositing a layer of Mg or $[Mg_{1-x}Zn_x]$ with lower concentrations of Zn in the presence of reactive oxygen. (In this case, Mg—Zn oxide tunnel barriers of two or more layers may be formed. These layers may be of the form $[Zn_{1-x}Mg_x]O$, in which the Mg atomic percentage is between 1 and 100, or between 1 and 99.) In general it may be advantageous to form the tunnel barrier 120' from a first layer of Zn or Mg or Mg—Zn, and then by depositing a sequence of Zn or Mg or Mg—Zn additional layers, in which each of the additional layers is formed in the presence of reactive oxygen. The amount of reactive oxygen may be varied from layer to layer. For example, it may be advantageous to have more oxygen for higher concentrations of Zn. It may also be preferable to have less reactive oxygen in the last additional layer onto which the ferromagnetic electrode 134 is subsequently deposited. The Mg—ZnO tunnel barrier 120' so formed may advantageously have a thickness of between 3 and 50 angstroms.

High tunneling magnetoresistance values have been found for a wide composition range of the ternary $[Mg_{1-x}Zn_x]O$ oxides, although the values are not typically as high as those found for oxides without any zinc. Typically, just as for MgO tunnel barriers, the TMR values were increased for thermal annealing at moderate temperatures, although the thermal stability was reduced compared to that of zinc-free MgO tunnel barriers. The thermal stability is very sensitive to the oxidation state of the $[Mg_{1-x}Zn_x]O$ layer, so that the properties of the MTJs are strongly dependent on the reactive sputtering conditions under which these oxide layers are formed, especially to the ratio of argon and oxygen in the sputter gas mixture.

Figure 2C:
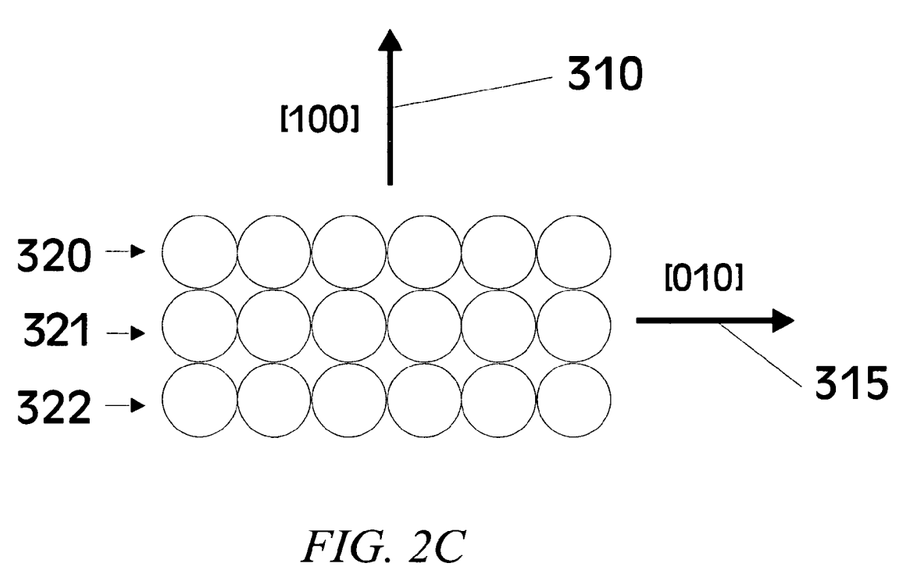
FIG. 2C is a schematic cross-section of the arrangement of the atoms in one of the layers of the textured magnetic tunnel junction formed according to the methodology of FIG. 2A.

The preferred embodiments and implementations of the invention are directed to certain magnetic layers and MgO or Mg—ZnO tunnel barrier layers which are substantially (100) oriented or textured. This is shown schematically in FIG. 2C, which shows the arrangement of atoms in a bcc structure oriented in the (100) direction with respect to the direction of tunneling of electrons. Layers 320, 321, 322 of atoms within an individual grain are shown for rows of atoms oriented along the [010] direction in-plane (indicated by the arrow 315) and (100) direction perpendicular to the plane (indicated by the arrow 310).

The pending applications to Parkin referenced above describe MTJs with high tunneling magnetoresistance using MgO tunnel barriers which use bcc CoFe or Fe electrodes; the use of amorphous ferromagnetic electrodes is described in U.S. patent application Ser. No. 10/884,831 to Parkin titled "High performance magnetic tunnel barriers with amorphous materials" filed Jul. 2, 2004. As described above, however, it may also be useful to use ferromagnetic or ferrimagnetic materials which are neither bcc nor amorphous.

The read performance of MTJ devices for MRAM applications is strongly influenced by the magnitude of the tunneling magnetoresistance. MTJs with amorphous alumina tunnel barriers are limited to tunneling magnetoresistance (TMR) values of up to ~70% at room temperature and low voltage bias. The use of MgO tunnel barriers formed in accordance with the methods described herein gives rise to TMR values as high as 220% (see Parkin et al., "Giant Tunneling Magnetoresistance at Room Temperature with MgO (100) Tunnel Barriers," Nature Mater. 3, 862-867 (2004)) or as high as 340% as described herein and illustrated in the exemplary data of FIG. 3. However, the MgO (and Mg—ZnO) tunnel barriers herein are crystalline, and although the tunnel barriers can be highly crystallographically textured in various orientations (for examples, 100 and 111) depending on the use of different underlayers on which the lower ferromagnetic electrode is deposited, the MgO layer (or Mg—ZnO) is comprised of individual crystallites or grains whose in-plane orientation varies from grain to grain. This means that the crystal structure of the ferromagnetic electrode deposited on top of this barrier will, to a greater or lesser extent, be influenced by the structure of the MgO (or Mg—ZnO) layer.

For ferromagnetic electrodes formed from bcc CoFe alloys (as described in U.S. patent application Ser. No. 10/973,954 to Parkin titled "MgO tunnel barriers and method of formation" filed Oct. 25, 2004), the crystal grains from which the CoFe layer is comprised grow in an epitaxial relationship with those of the underlying MgO (or Mg—ZnO) layer. Since CoFe alloys exhibit significant crystalline magnetic anisotropy, this means that the magnetic moments of the CoFe crystallites will be oriented in different directions in the plane of the CoFe film. Moreover, the anisotropy can be significant. As the size of MTJ devices shrinks to deep sub-micron dimensions, the number of crystallites will be reduced so that there will likely be significant variations in the magnetic switching characteristics (easy and hard axis coercive fields and hard axis anisotropy) of the storage layer of individual MTJ elements. This effect can be mitigated by the use of amorphous ferromagnetic layers, preferably formed from CoFeB alloys, as described in the pending applications to Parkin titled "High performance magnetic tunnel barriers with amorphous materials" (application Ser. No. 10/884,831 filed Jul. 2, 2004) and "Magnetic tunnel junctions using amorphous materials as reference and free layers" (application Ser. No. 10/904,449 filed Nov. 10, 2004).

In certain preferred methods of the current invention, a highly oriented layer of crystalline MgO (or Mg—ZnO) is first formed to provide an interface with a ferromagnetic electrode (preferably formed from Co—Fe or Co—Fe—B alloys) that displays very high tunneling spin polarization. This layer is crystalline and preferably highly oriented in the 100 crystallographic direction. Moreover, this layer is in the form of a dielectric oxide before a layer of an amorphous rare earth element oxide (REO) is deposited in a second step.

The giant tunneling magnetoresistance for MTJs with (100) oriented crystalline MgO tunnel barriers is theorized to be due to coherent tunneling of the electrons across the tunnel barrier, so that one might expect crystalline ferromagnetic electrodes to be required whose crystalline structure is matched and aligned with that of the MgO layer. In U.S. patent application Ser. No. 11/099,184 to Parkin entitled "Magnetic tunnel junctions including crystalline and amorphous tunnel barrier materials" filed Apr. 4, 2005 it is shown that the requirement of coherently tunneling electrons across the entire tunnel barrier is not needed and that rather the ferromagnet/MgO combination itself gives rise to highly spin polarized electrons.

In U.S. patent application Ser. No. 11/099,184 to Parkin it is demonstrated that that the TMR of a MTJ with a bilayer tunnel barrier formed from crystalline MgO and amorphous $Al_2O_3$ is between the TMR of a MTJ having a single layer of MgO and the TMR of a MTJ having a single layer of $Al_2O_3$. The TMR is directly related to the spin polarization of the electrons tunneling from one FM electrode/dielectric interface to the other dielectric/FM interface. Thus, the polarization of the CoFe/MgO interface is as much as 85% at low temperatures, whereas that of the CoFe/$Al_2O_3$ interface is 55%. Using Julliere's formula (see Phys. Lett. 54A (3), 225-226 (1975)), the TMR may then be deduced using two distinct polarization values for the ferromagnet/MgO interface and the $Al_2O_3$/ferromagnet interface. The polarization of the former is much higher than the latter.

The properties of an MTJ with a bilayer tunnel barrier of MgO/REO may be understood by considering that the MTJ has two independent interfaces with two corresponding spin polarization values. Using Julliere's formula, the TMR may then be deduced using the polarization value for the ferromagnet/MgO interface, which is considerably higher than that for the FM/REO interface.

Figure 4A:
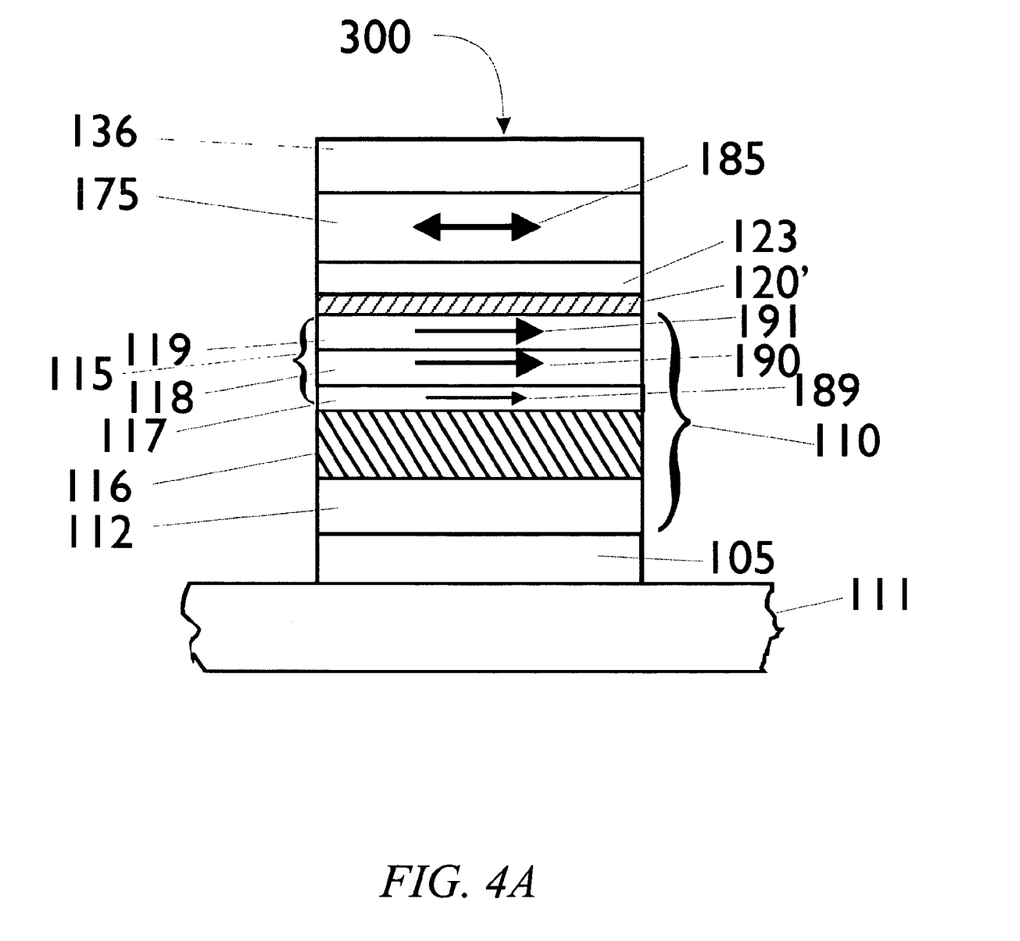
FIGS. 4A and 4B are cross-sectional views of still other magnetic tunnel junctions of the present invention.

FIG. 4A shows an MTJ device of the current invention that has high tunneling magnetoresistance, with a tunnel barrier formed by first depositing a layer of MgO (or Mg—ZnO) 120' (as described herein), followed by depositing a second dielectric layer of a rare-earth oxide 123. The layer 120' may be formed by depositing a layer of Mg, which is substantially free of oxygen, and then subsequently converting it to a layer of MgO when the REO layer 123 is deposited in a subsequent step. (Likewise, a layer of Mg and Zn, which is substantially free of oxygen, may be converted to a layer of Mg—ZnO when the REO layer 123 is deposited.) Alternatively, the layer 120' may be formed by the methods described in the preceding paragraphs, by first forming an ultra thin layer of Mg and subsequently depositing a layer of Mg in the presence of oxygen. Alternatively, a layer of MgO may be formed using a deposition method that does not substantially result in oxidation of the underlying electrode. The second dielectric layer 123 is amorphous and so is substantially free of crystal grains and their associated grain boundaries. Thus, layers formed from amorphous materials tend to be much flatter than layers formed from crystalline materials. This is advantageous with respect to the properties of ferromagnetic layers formed on such surfaces. In addition to the increased dispersion of magneto-crystalline anisotropy fields for ferromagnetic layers formed on crystalline underlayers, thin ferromagnetic layers, if rough, can display the well-known Neel orange-peel coupling with the ferromagnetic layer on the opposing side of the intervening layer.

Grain boundaries in crystalline tunnel barriers can also lead to "weak" spots in the tunnel barrier where electrical current passed through the tunnel barrier may preferentially tunnel. The increased local density of current will likely increase the probability of electrical breakdown at lower bias voltages than would otherwise be the case for layers without such "hot spots".

Preferred structures and methods of forming certain MTJ devices are now described. The structures are formed by magnetron sputtering using an argon sputter gas at a pressure of 3 mTorr unless otherwise stated. All the layers are formed at ambient temperature. The MTJ device shown in FIG. 4A has an exchange biased reference electrode 110 formed beneath the MgO (or Mg—ZnO)/REO bilayer tunnel barrier (120'/123). The magnetic state of the reference electrode 110 remains unchanged during the operation of the device. The antiferromagnetic layer 116 is used to set the direction of the moment of the ferromagnetic layer 115 by exchange bias. The direction of the exchange bias field is set either during the fabrication of the MTJ device or by heating the device above the blocking temperature of the antiferromagnetic layer and cooling the device in the presence of a magnetic field that is sufficiently large to align the moment of the layer 115 along a given direction. Although use of the antiferromagnetic layer 116 is preferred, the device may be built without it. The direction of the reference electrode 115 is then maintained during the operation of the device by providing a uniaxial anisotropy field. This may be provided by the intrinsic magneto-crystalline anisotropy of the layer 115, or it may be provided by the shape anisotropy of the reference electrode or by other means.

In FIG. 4A the direction 185 of the magnetization of the storage layer 175, located above the upper layer of the tunnel barrier 123, is maintained either parallel or antiparallel to that of the layer 115 (on the other side of the bilayer tunnel barrier) during the operation of the device. The MTJ device of FIG. 4A may also be inverted, such that the reference ferromagnetic electrode is formed above the tunnel barrier and the storage layer is formed beneath the tunnel barrier.

Likewise, the device may be formed so that the REO tunnel barrier 123 is positioned above or below the crystalline tunnel barrier 120'. In some situations, it may be preferable to first form an REO layer followed by a crystalline layer of MgO (or Mg—ZnO). As shown in US patent applications to Parkin titled "High performance magnetic tunnel barriers with amorphous materials" (application Ser. No. 10/884,831 filed Jul. 2, 2004) and "Magnetic tunnel junctions using amorphous materials as reference and free layers" (application Ser. No. 10/904,449 filed Nov. 10, 2004), MgO layers can be grown crystalline and highly 100 oriented when deposited on an amorphous underlayer. Similarly, MgO can be grown highly 100 oriented when deposited on an amorphous layer of alumina. When the MgO layer is deposited on REO, it may not be necessary to use an Mg underlayer, but the MgO layer may be directly deposited by reactive magnetron sputtering from a Mg target using an argon-oxygen gas mixture or by various other means including pulsed laser deposition, thermal or electron beam evaporation from an MgO target or by ion beam sputtering from an MgO target or from a Mg target in the presence of reactive oxygen.

In FIG. 4A, the substrate 111 is formed from an amorphous layer of $SiO_2$ formed on a silicon substrate. The underlayer or bottom electrical lead 112 is comprised of 50 Å Ta, which is deposited on a layer 105 of 100 Å MgO. The layer 112 may also comprise a layer of TaN deposited on top of the MgO layer. The TaN layer is formed by reactive sputtering of Ta in an Ar—$N_2$ mixture containing 6% $N_2$. An antiferromagnetic layer 116 of 250 Å thick IrMn is deposited on the Ta layer by ion beam sputter deposition using a beam of energetic krypton ions from an rf plasma ion source. The sputtering target used to form the IrMn layer has a composition of $Ir_{22}Mn_{78}$. Next, a ferromagnetic layer 117 of 3 Å $[Co_{70}Fe_{30}]_{70}B_{30}$ is deposited followed by a layer 119 of 60 Å $Co_{70}Fe_{30}$. The reference electrode 115 may comprise more than one CoFe or CoFeB layers of various compositions, e.g., there may be a layer 118 comprised of $Co_{86}Fe_{14}$. The moments of the layers 117, 118 and 119 are parallel to one another because these layers are strongly ferromagnetically exchange coupled; thus they act as a single ferromagnetic layer 115. The directions of the magnetic moments of the layers 117, 118 and 119 are shown as the arrows 189, 190 and 191, respectively in FIG. 4A. The reference ferromagnetic layer 115 may also be formed from a single ferromagnetic layer which may be comprised of a Co—Fe alloy whose structure is bcc or from a layer of pure Fe or from an amorphous CoFeB layer, for example, $[Co_{70}Fe_{30}]_{80}B_{20}$.

An MgO layer 120' is then formed on top of the lower ferromagnetic electrode 110 using the method described in U.S. patent application Ser. No. 10/973,954 to Parkin titled "MgO tunnel barriers and method of formation" (filed Oct. 25, 2004), by first depositing a thin layer of Mg having a thickness in the range of 3 to 20 Å, for example, followed in a second step by the deposition of a layer of Mg in the presence of reactive oxygen. The thickness of the second layer, which is comprised of MgO, is typically in the range from 3 to 20 Å depending on the desired resistance-area product, which can range up to more than $10^9$ $\Omega(\mu m)^2$. For the device of FIG. 4A, a Mg layer 8 Å thick was used, followed by an MgO layer 25 Å thick formed by reactive magnetron sputtering using an argon-oxygen plasma containing 3 atomic percent oxygen. During the deposition of the MgO layer, the Mg underlayer becomes oxidized so that the two layers form a single MgO tunnel barrier. The exact composition of the MgO layer may differ slightly from the stoichiometric composition but Rutherford backscattering data on companion films of MgO, 500 Å thick, show that, within experimental error, the MgO layer contains 50 atomic percent O and 50 atomic percent Mg. (Alternatively, the layer 120' may comprise Mg—ZnO, as discussed above.)

A layer of REO 123 is then deposited on top of the crystalline layer 120' by reactive sputtering from a rare-earth metal target in the presence of an argon-oxygen gas mixture. The proportion of oxygen in the gas mixture depends on the detailed configuration of the sputter deposition system and the rate of flow of sputtering gas into the deposition system. Typical concentrations of oxygen are in the range from 2 to 10 atomic percent but preferred concentrations use as little oxygen as possible. For the structure shown in FIG. 4A, the flow of oxygen into the sputter chamber ranged from 1 to 7 percent of that of the flow of argon into the chamber. The REO layer can also be formed by the evaporation of the corresponding rare-earth metal from a Knudsen cell in the presence of atomic oxygen formed from an rf discharge in an enclosed cavity within the deposition chamber. This method has the advantage of using much lower concentrations of oxygen. In another method, the REO layer can be formed by ion beam sputter deposition from a metallic rare-earth target in the presence of reactive oxygen, for example, formed within an atomic oxygen source. The REO 123 may also be formed by sputter-deposition (either rf magnetron or ion beam) or by pulsed laser deposition from an insulating target of the rare-earth oxide.

The rare earth element oxide can be formed from most of the rare-earth elements including, preferably Lu which is non-magnetic. As used herein, the term "rare-earth elements" includes (in addition to Lu) Ce, Pr, Nd, Pm, Sm, Eu, Gd, Tb, Dy, Ho, Er, Tm, and Yb, which form rare earth element oxides of the form $RE_2O_3$ (RE=rare-earth). Rare-earth oxide tunnel barriers can also be formed from oxides of Cerium but these oxides typically contain higher concentrations of oxygen since Ce is multivalent and so typically will form $CeO_2$.

The rare-earth oxides form oxides which are highly thermally stable because of their strong affinity for oxygen (very high enthalpy of formation) and which are typically amorphous in thin film form. These layers are also ultra smooth. For all these reasons rare earth element oxide layers form excellent tunnel barriers and are, for example, being considered for advanced gate dielectrics. The REO may also be formed from oxides of combinations of one or more rare-earth elements.

The rare-earth layer 123 may also be formed by first depositing a thin layer of the rare-earth metal and then plasma-oxidizing this layer using reactive oxygen either from an atomic oxygen source or from an oxygen plasma created in the vicinity of the first deposited rare earth metal layer and preferably with the application of a bias voltage of a few volts to the sample substrate. When the REO layer is formed on a magnetic underlayer, the rare-earth metal layer is preferably chosen to be of a thickness sufficient to substantially cover the underlying magnetic layer so as to prevent the surface of the ferromagnetic layer from being oxidized during the subsequent growth of the REO layer.

The REO layer 123 is preferably grown with a thickness in the range from 2 to 30 angstroms and more preferably with a thickness in the range from 2 to 20 angstroms.

Next, the MTJ device shown in FIG. 4A is completed by forming the top ferromagnetic electrode 175, which is the storage layer. In FIG. 4A the storage layer can actually be comprised of two ferromagnetic layers. First a thin layer of 20 Å $Co_{70}Fe_{30}$ is deposited on the MgO (or Mg—ZnO) tunnel barrier 120'. Second, an amorphous ferromagnetic layer is formed (over the thin $Co_{70}Fe_{30}$ layer), which is here comprised of 150 Å thick $(Co_{70}Fe_{30})_{70}B_{30}$. This amorphous layer is formed by magnetron sputtering in a pure argon plasma where the target composition may vary slightly from that of the deposited film. The preferred thickness of the amorphous CoFeB layer is in the range from 10 to 30 angstroms, and the preferred thickness of the thin CoFe layer is in the range from 5 to 12 angstroms. Alternatively, the storage layer 175 may be formed from a single layer composed of either the thin CoFe layer or the amorphous layer; in this case, the preferred thickness of the single layer is in the range from 10 to 40 angstroms.

The storage layer may also be comprised of a synthetic antiferromagnetic layer comprised of two or more ferromagnetic or ferrimagnetic layers coupled antiferromagnetically, in the absence of any applied magnetic field, by the use of a thin antiferromagnetic coupling layer such as a thin layer of Ru or Os or a Ru—Os alloy or Cu.

Finally, the device 300 of FIG. 4A is completed by forming a capping layer 136 which is comprised of 100 Å Ta followed by 75 Å Ru. The layer 136 may also be formed from TaN or from a combination of Ta and TaN. The TaN layer is formed by reactive magnetron sputtering using an argon-nitrogen plasma containing about 8% nitrogen. The Ru layer is formed by ion beam sputtering. The amount of nitrogen in the sputter gas mixture used to form the TaN layer may be different for the growth of the capping layer 136 and the underlayer 112, in order to optimize the thermal stability of the structure and the crystallographic texture of the MgO (or Mg—ZnO) barrier for the highest tunneling magnetoresistance values. The capping layer may also be comprised of a thin oxide layer, such as a thin layer of MgO or alumina, which may improve the thermal stability of the device.

The TMR of MTJs having MgO barriers formed according to the current invention can be considerably increased by thermal annealing (see U.S. patent application Ser. No. 10/973,954 to Parkin titled "MgO tunnel barriers and method of formation" filed Oct. 25, 2004). Similarly, the TMR of the MTJs of the current invention using MgO/REO bilayers can be advantageously increased by thermal annealing.

Figure 4B:
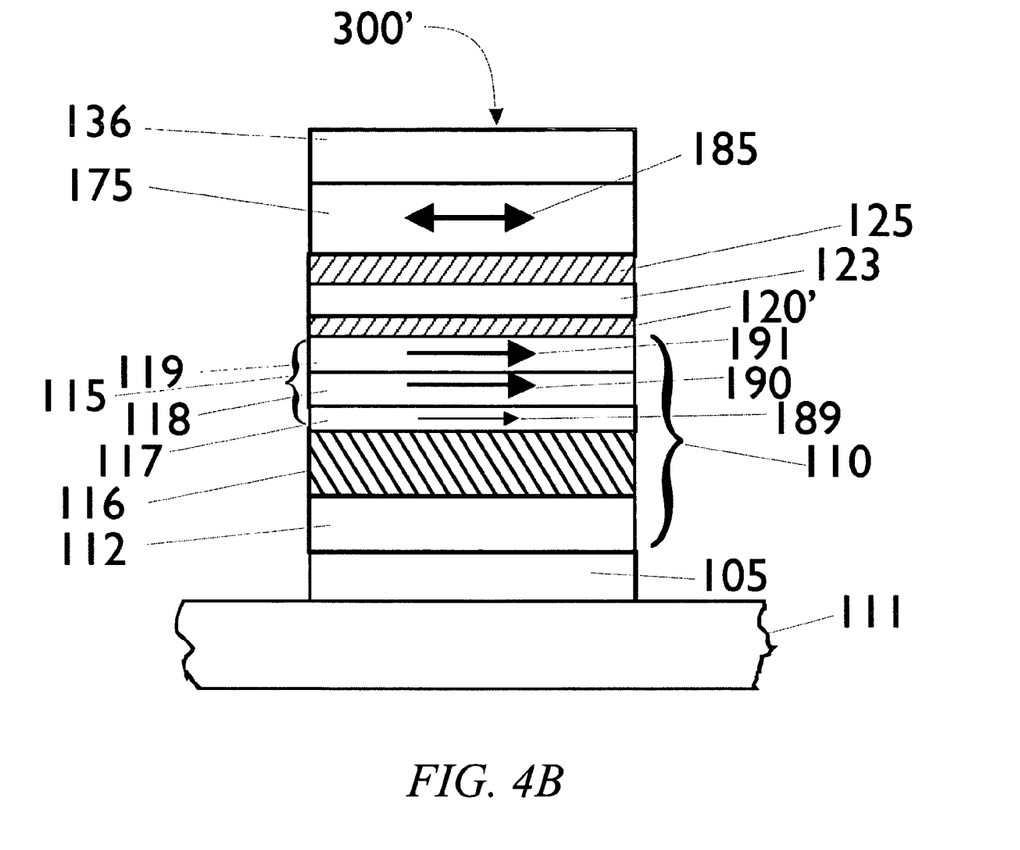

In another preferred embodiment of the current invention, the tunnel barrier is formed from a trilayer 120'/123/125 comprised of MgO/REO/MgO, as illustrated in FIG. 4B. After the deposition of the REO layer 123, a second MgO layer 125 is formed by methods similar to those used to form the layer 120' except that the Mg underlayer is not required. The layer 125 may alternatively be comprised of $Al_2O_3$ which may be amorphous so as to form a trilayer barrier of the form MgO/REO/$Al_2O_3$. The order of the layers 123 and 125 may be reversed so as to form a trilayer barrier with the structure MgO/$Al_2O_3$/REO. In another embodiment the sequence of these layers may be reversed so that the REO layer or $Al_2O_3$ layer is formed first. It may be preferable to form the $Al_2O_3$ layer by first depositing an ultra thin layer of aluminum metal approximately 1.5 to 4 A thick followed by deposition of an $Al_2O_3$ layer using, for example, reactive sputter deposition of aluminum in an argon-oxygen gas mixture, or by some other method which provides oxygen (which may be molecular) to oxidize the first deposited aluminum layer without substantially oxidizing the underlying layer. The thickness of the deposited Al layer is sufficient to substantially cover the underlying electrode. By comparison with Mg, a thinner layer of Al is typically sufficient to substantially cover the underlying layer without resulting in oxidation of this layer during the subsequent oxidation of the metallic Al layer. (Note that Mg—ZnO may be used instead of MgO in one or more of the layers of this device.)

While the preferred embodiments of the current invention apply to structures with (100) texturing for the highest possible TMR or spin polarization values, the structures and devices described herein may be prepared in other crystallographic orientations, such as (111), and so be advantageous in other regards.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A device, comprising:
   a tunnel barrier structure, the structure including
   i) a first layer that includes a rare earth element oxide tunnel barrier, and
   ii) a second layer that includes at least one of a crystalline MgO tunnel barrier and a crystalline Mg—ZnO tunnel barrier; and
   an underlayer in contact with the tunnel barrier structure, wherein the underlayer, the first layer, and the second layer are in proximity with each other, thereby enabling spin-polarized charge carrier transport between the underlayer and the first and second layers, wherein the underlayer includes a material selected from the group consisting of ferrimagnetic materials, ferromagnetic materials, and semiconducting materials.

2. The device of claim 1, wherein the first layer is amorphous.

3. The device of claim 1, wherein the underlayer includes at least one of Si and GaAs.

4. The device of claim 1, wherein the underlayer includes a material selected from the group consisting of ferrimagnetic materials and ferromagnetic materials.

5. The device of claim 4, further comprising an overlayer that includes a material selected from the group consisting of ferrimagnetic materials and ferromagnetic materials, wherein the underlayer, the tunnel barrier structure, and the overlayer form a magnetic tunnel junction.

6. The device of claim 4, wherein the second layer includes crystalline grains that are substantially (100) oriented.

7. The device of claim 1, the tunnel barrier structure further comprising an $Al_2O_3$ tunnel barrier.

8. The device of claim 1, wherein the rare earth element oxide includes an oxide of Lu.

9. The device of claim 1, wherein the rare earth element oxide includes an oxide of Gd.

10. The device of claim 1, wherein the rare earth element oxide includes an oxide of Yb.

11. A method of forming the device of claim 1, comprising:
    forming the second layer by:
    depositing at least one first metal onto a surface of the underlayer to form a metal layer thereon, wherein the surface is substantially free of oxide; and
    directing at least one second metal, in the presence of oxygen, towards the metal layer to form a metal oxide tunnel barrier in contact with the underlayer, the oxygen reacting with the second metal and the metal layer, wherein the metal oxide tunnel barrier includes Mg; and forming the first layer by forming a rare earth element oxide tunnel barrier over the metal oxide tunnel barrier.

12. The method of claim 11, wherein the metal oxide tunnel barrier includes a MgO tunnel barrier.

13. The method of claim 11, wherein the metal oxide tunnel barrier includes a Mg—ZnO tunnel barrier.

14. The method of claim 11, further comprising annealing the metal oxide tunnel barrier to improve its performance.

15. A method of forming the device of claim 1, comprising:
depositing at least one first metal that includes Mg onto a surface of the underlayer to form a metal layer thereon, wherein the surface is substantially free of oxide; and
directing at least one second metal that includes a rare earth element, in the presence of oxygen, towards the metal layer to form a bilayer in contact with the underlayer, the bilayer including the first layer and the second layer.

16. A device, comprising:
a first magnetic layer;
a second magnetic layer, wherein each of the first and second magnetic layers includes a material selected from the group consisting of ferrimagnetic materials and ferromagnetic materials;
a first tunnel barrier layer that includes a rare earth element oxide tunnel barrier; and
a second tunnel barrier layer that includes at least one of a crystalline MgO tunnel barrier and a crystalline Mg—ZnO tunnel barrier, the first and second tunnel barrier layers forming a bilayer of tunnel barriers, wherein the first magnetic layer, the tunnel barrier bilayer, and the second magnetic layer form a magnetic tunnel junction.

17. The device of claim 10, wherein the first and second magnetic layers each include a Co—Fe alloy, and the rare earth element oxide includes an oxide of at least one of Lu, Gd, and Yb.

18. The device of claim 10, wherein the device has a tunneling magnetoresistance of greater than 100% at room temperature.

19. The device of claim 10, wherein the device has a tunneling magnetoresistance of greater than 200% at room temperature.

20. The device of claim 10, wherein the device has a tunneling magnetoresistance of greater than 300% at room temperature.

* * * * *